United States Patent
Yang et al.

(10) Patent No.: US 9,086,461 B2
(45) Date of Patent: Jul. 21, 2015

(54) CIRCUIT FOR MEASURING VOLTAGE OF BATTERY AND POWER STORAGE SYSTEM USING THE SAME

(75) Inventors: Jong-Woon Yang, Yongin-si (KR); Tetsuya Okada, Yongin-si (KR); Eui-Jeong Hwang, Yongin-si (KR)

(73) Assignee: Samsung SDI Co., Ltd., Gyeonggi-Do (KR)

( * ) Notice: Subject to any disclaimer, the term of this patent is extended or adjusted under 35 U.S.C. 154(b) by 394 days.

(21) Appl. No.: 13/540,516

(22) Filed: Jul. 2, 2012

(65) Prior Publication Data

US 2013/0141106 A1    Jun. 6, 2013

(30) Foreign Application Priority Data

Dec. 2, 2011 (KR) .......................... 10-2011-0128070

(51) Int. Cl.
*G01N 27/416*  (2006.01)
*G01R 31/36*  (2006.01)

(52) U.S. Cl.
CPC .......... *G01R 31/362* (2013.01); *G01R 31/3658* (2013.01)

(58) Field of Classification Search
USPC .......................... 320/127, 134, 137, 149, 161
See application file for complete search history.

(56) References Cited

U.S. PATENT DOCUMENTS

| | | | |
|---|---|---|---|
| 5,525,890 A * | 6/1996 | Iwatsu et al. ................. | 320/106 |
| 7,719,284 B2 * | 5/2010 | Ohta et al. .................... | 324/434 |
| 2002/0121901 A1 * | 9/2002 | Hoffman ....................... | 324/426 |
| 2010/0295382 A1 * | 11/2010 | Tae et al. ....................... | 307/150 |

FOREIGN PATENT DOCUMENTS

| | | |
|---|---|---|
| JP | 2008-139261 A | 6/2008 |
| KR | 10-2008-0054901 A | 6/2008 |
| KR | 10-2010-0099421 A | 9/2010 |

* cited by examiner

*Primary Examiner* — Edward Tso
*Assistant Examiner* — Robert Grant
(74) *Attorney, Agent, or Firm* — Knobbe Martens Olson & Bear LLP

(57) ABSTRACT

A circuit for measuring voltage of a battery and a power storage system using the same. According to one aspect, the circuit includes a switching element connected to the battery and configured to output a first signal at a first voltage level. The switching element is configured to be turned-on in response to a voltage measuring control signal. The circuit also includes a voltage conversion circuit connected to the switching element. The voltage conversion circuit is configured to output a second signal at a second voltage level that is proportional to the first voltage level. An analog-digital converter is configured to receive the second signal and convert the received second signal into a digital signal. A controller is configured to transfer the voltage measurement control signal to the switching element, and receive the digital signal from the analog-digital converter.

19 Claims, 3 Drawing Sheets

CIRCUIT FOR MEASURING VOLTAGE OF BATTERY AND POWER STORAGE SYSTEM USING THE SAME

CROSS-REFERENCE TO RELATED APPLICATIONS

This application claims priority to and the benefit of Korean Patent Application No. 10-2011-0128070, filed on Dec. 2, 2011, in the Korean Intellectual Property Office, the entire content of which is incorporated herein by reference.

BACKGROUND

1. Field

The technical field relates to a circuit for measuring voltage of a battery and a power storage system using the same, and more particularly, to a circuit for measuring voltage of a battery and a power storage system using the same capable of measuring high voltage output from a number of batteries.

2. Description of the Related Technology

As environmental pollution and traditional power generation resources deplete, there is greater and greater interest on a system capable of storing power and capable of efficiently utilizing the stored power. Particularly, renewable energy systems utilize natural resources, such as solar, wind, tidal, to generate power that does not cause pollution during the power generation process. As a result, research regarding utilization of natural resources to generate power is of interest.

A photovoltaic system, which is one example of an apparatus configured to utilize renewable energy, converts DC power generated by one or more solar cells into AC power. A photovoltaic system may supply the power to a load by connecting the converted AC power to a power grid. When the amount of power generated by the solar cell is less than the amount of power consumed by an associated load, substantially all of the power generated by the solar cell is consumed by the load, and additional power is supplied from the power grid to power the load. Further, when the power generated by the solar cell is greater than power consumed by the load, the surplus power is supplied to the power grid.

SUMMARY OF CERTAIN INVENTIVE ASPECTS

According to one aspect, a circuit for measuring voltage of a battery is disclosed. The circuit includes a switching element connected to the battery and configured to output a first signal at a first voltage level, the switching element being configured to be turned-on in based on a voltage measurement control signal, a voltage conversion circuit connected to the switching element and configured to output a second signal at a second voltage level proportional to the first voltage level, an analog-digital converter configured to receive the second signal and convert the received second signal into a digital signal, and a controller configured to transfer the voltage measurement control signal to the switching element, and to receive the digital signal from the analog-digital converter.

According to another aspect, a power storage system is disclosed. The power storage system includes at least one battery, at least one sub-battery management systems connected to each of the batteries and configured to perform management of a corresponding battery, and a main battery management system configured to receive data corresponding to the batteries from the sub-battery management systems, the main battery management system including a detection circuit configured to measure voltage output of the batteries. The detection circuit includes a switching element, the switching element configured to receive a signal at a first voltage level, and wherein the switching element is configured to be turned on in response to a voltage measurement control signal, a voltage conversion circuit connected to the switching element and configured to output a second signal at a second voltage level that is proportional to the first voltage level, an analog-digital converter configured to receive the second signal and convert the received second signal into a digital signal, and a controller configured to transfer the voltage measurement control signal to the switching element, and to receive the digital signals from the analog-digital converter.

According to another aspect, a method for measuring voltage of a battery is disclosed. The method includes receiving a voltage measurement control signal from a controller, outputting a first signal at a first voltage level via a switching element in response to the voltage measurement control signal, the switching element being configured to isolate the battery from the controller, outputting a second signal at a second voltage level proportional to the first voltage level, converting the second signal into a digital signal, receiving the digital signal from the analog-digital converter, and determining at least one characteristic of the battery based on the received digital signal.

BRIEF DESCRIPTION OF THE DRAWINGS

The accompanying drawings, together with the specification, illustrate some embodiments of the present invention, and, together with the description, serve to explain the principles of the present invention.

DETAILED DESCRIPTION OF CERTAIN INVENTIVE EMBODIMENTS

Figure 1:
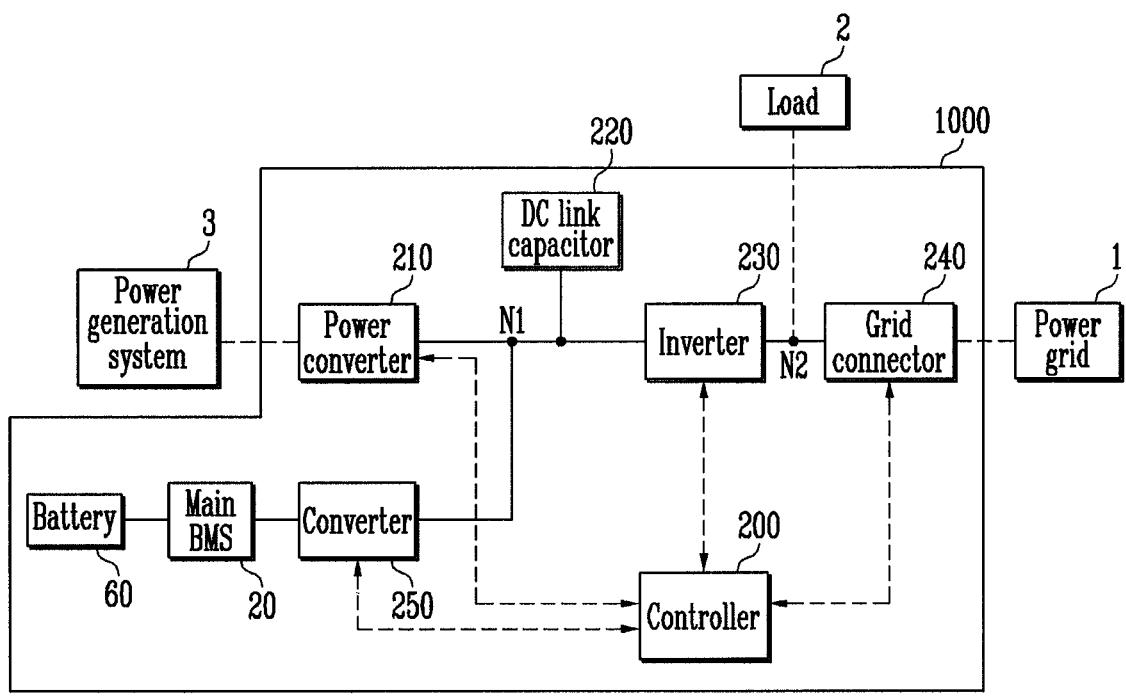
FIG. 1 shows an energy storage system and a power storage system of an embodiment of the invention.

Hereinafter, some embodiments will be described with reference to the accompanying drawings. Throughout the description, when a first element is described as being coupled to a second element, the first element may be not only directly coupled to the second element but may also be indirectly coupled to the second element via a third element. Further, some of the elements that are not essential to the complete understanding of the embodiments are omitted for clarity. Further, like reference numerals refer to like elements throughout.

Benefits and features of the invention and how to achieve them will become clear with reference to some embodiments to be described below in detail along with the accompanying drawings. However, the invention is not limited to some embodiments disclosed below and can be implemented with a variety of different forms. When any part in the description below is connected to the other part, this means an indirect connection to dispose other device between the parts as well as a direct connection. In addition, the parts that are not related to the invention in the drawings are omitted to clarify the invention, and the same numerals are attached to similar parts throughout the specification.

A power storage system can be configured to store the surplus power produced from the grid at night into the energy storage device, and use the stored surplus power by day.

Therefore, the power storage system may meet the peak requirements of a load connected to the power generation power by day by utilizing the power generated at night. The power storage system can use a battery pack as the energy storage device in order to reduce the space occupied by a corresponding power storage system, thereby enabling installation of the power storage system in buildings or the like. In addition, the power storage system can be capable of receiving the power from battery packs during a power outage.

Since the total voltage output from a number of batteries connected to each other directly affects performance of an apparatus using the battery, voltage detection integrated circuits (ICs) for measuring the total voltage of the battery have been separately provided in the power storage system. However, a circuit of the voltage detection IC may be complex and therefore, manufacturing cost is high.

FIG. 1 shows an energy storage system and a power storage system according to some embodiments.

As shown in FIG. 1, the energy storage system includes a power generation system 3 configured to generate electrical energy, a load 2 configured to consume power, a power grid 1 configured to transfer the electrical energy, and an energy storage system 1000.

In the power storage system 1000, the power produced by the power generation system 3 is supplied to the load 2 or the power grid 1 through the power storage system 1000, or may be stored into the power storage system 1000.

Further, the power storage system 1000 can receive the power from the power grid 1 and transfer the received power to power the load 2. Alternatively, the power storage system 1000 may be configured to power the load 2 utilizing power supplied from the power grid 1. Further, the power stored by the power storage system 1000 can be supplied to the load 2, or supplied to the power grid 1, and therefore, commercial power transmission is possible.

The power storage system 1000, which has a storage space of predefined size, may be implemented as, for example, a container type.

The power grid 1 is a system of electrical connection including a power plant, a substation, and transmission lines. According to some embodiments, when the power grid 1 is in a normal operating state, power is supplied to the power storage system 1000 or the load 2. Further, the power grid 1 receives power from the power storage system 1000 and transfers the received power to another power storage system, a load (e.g. load 2 or a different load connected to the power grid 1), a power plant, or a substation. When the power grid 1 is in an abnormal operating state, power supplied from the power grid 1 to the power storage system 1000 or the load 2 is stopped. Further, power supply from the power storage system 1000 to the power grid 1 is also stopped.

The load 2 receives power from the power storage system 1000 or receives commercial power from the power grid 1. For example, the load 2 becomes facilities such as house, building factory consuming the power.

The power generation system 3 converts energy, such as renewable and non-renewable energy into electrical energy to supply to the power storage system 1000. According to some embodiments, the power generation system 3 may be a non-renewable energy and/or renewable energy power generation system using renewable energy such as sunlight, water, geothermal, precipitation, and biological organisms. For example, the power generation system 3 may be a photovoltaic system configured to convert solar energy, such as solar heat and solar light, into electrical energy through operation of solar cells. In addition, the power generation system 3 may be a wind generation system configured to convert wind power into electrical energy, a geothermal power generation system configured to convert geothermal heat into electrical energy, a hydroelectric power system and/or an ocean power plant system. Further, the power generation system 3 may be a power generation system configured to produce electrical energy using fuel cells, or configured to produce electrical energy using hydrogen, coal liquefied gas, heavy residue oil gas, or the like.

As shown in FIG. 1, the power storage system 1000 can be configured to store the power supplied from the power generation system 3 or the power grid 1, and supply the stored power to the power grid 1 and/or the load 2.

Figure 2:
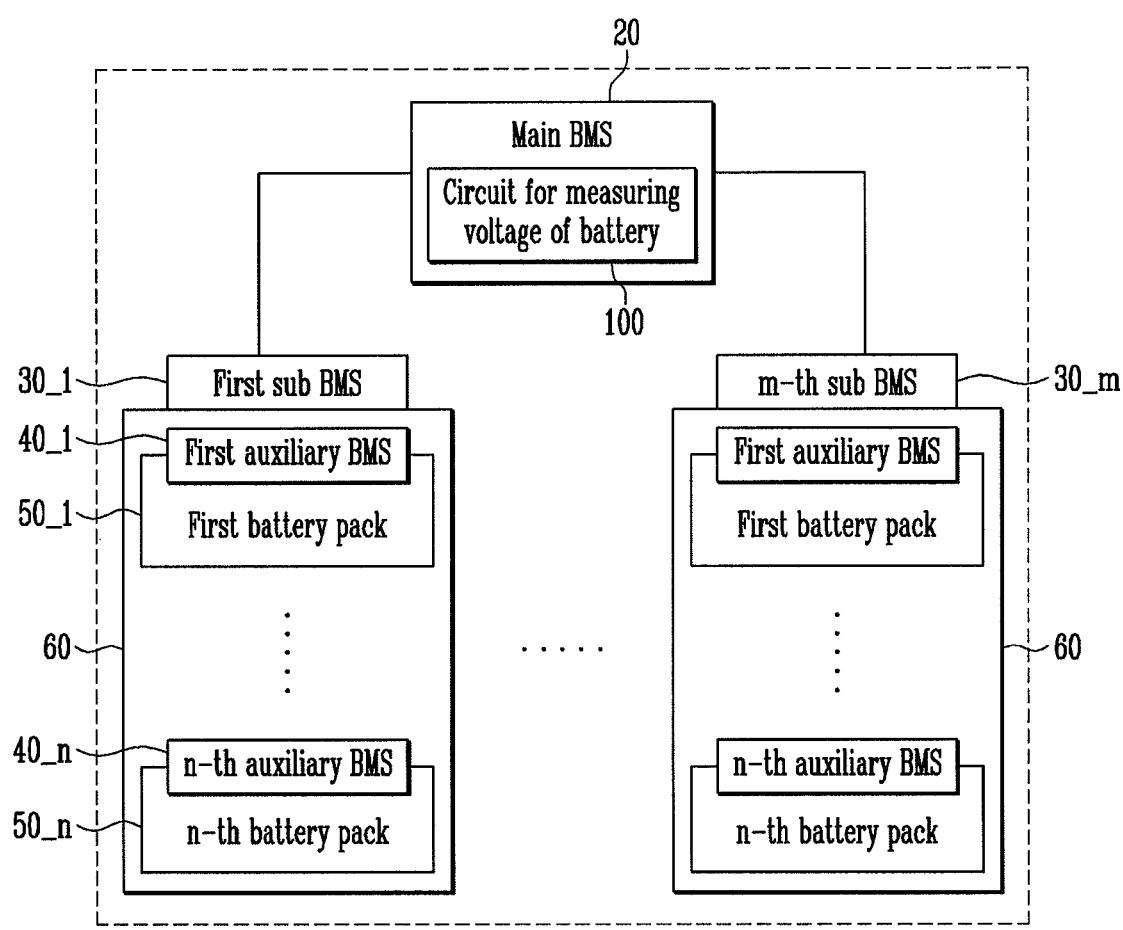
FIG. 2 shows a main battery management system, sub-battery management system and battery according to the embodiment of the invention.

FIG. 2 shows a main battery management system, sub-battery management systems and batteries according to some embodiments.

With reference to FIGS. 1 and 2, the power storage system 1000 according to some embodiments includes batteries 60, sub battery management systems 30_1-30_m, and a main battery management system 20. For convenience of illustration, FIG. 1 does not show the sub battery management system.

Further, the power storage system 1000 further includes a power converter 210, a DC link capacitor 230, an inverter 220, a grid connector 240, a converter 250, and a controller 200.

The power storage system 1000 includes a number of batteries configured to output high voltage, and a number of batteries 60 are connected to each other in serial or in parallel to supply power to apparatuses that require the power.

Each of the batteries 60 includes a number of battery packs 50_1-50_n.

The battery packs 50_1-50_n can be configured as a secondary cell capable of charging and discharging, and can have medium-large size cells. For example, the battery pack 50_1-50_n may be a nickel-cadmium battery, a lead battery, a nickel metal hydride battery, a lithium ion battery, a lithium polymer battery, or the like.

Further, a number of battery packs 50_1-50_n included in each of the batteries 60 may be connected to each other in serial and/or in parallel.

A number of sub-battery management systems 30_1-30_m are disposed for each battery 60 to manage a state of a corresponding battery. For example, a number of sub-battery management systems 30_1-30_m control charging and discharging of the batteries 60 reflecting state of charge (SOC) and state of health (SOH).

Further, overheating of the batteries 60 which may result from rapid temperature rise may be prevented by controlling temperature of the batteries 60.

The sub-battery management systems 30_1-30_m include a protection circuit configured to perform a sensing function to detect voltage, current and temperature of the battery 60. The sub-battery management systems 30_1-30_m may be configured to also control functions such as charging and discharging of the battery, controlling fuse blowout, and cooling of the battery based on control signals generated by a controller for determining overcharge, overdischarge, overcurrent, cell balancing, SOC, and SOH according to the sensing operation.

The sub battery management systems 30_1-30_m may individually control battery packs 50_1-50_n included in each of the batteries 60 while communicating with auxiliary battery management systems (40_1-40_n) disposed for each of the battery packs 50_1-50_n.

A main battery management system 20 may generally control a number of batteries 60 while communicating with a number of sub-battery management systems 30_1-30_m. Battery data may be received from the sub-battery management systems 30_1-30_m. The data related to the battery may include temperature, voltage, and current etc. of the battery representing the state of the corresponding battery.

Further, the main battery management system 20 includes a circuit 100 for measuring voltage output from a number of batteries 60. The power converter 210 is connected between the power generation system 3 and a first node N1. The power converter 210 converts the power produced from a power generation system 3 into DC voltage present at the first node N1. An operation of the power converter 210 may be varied according to the power generated by the power generation system 3. For example, when the power generation system 3 generates AC voltage, the power converter 210 converts the AC voltage into DC voltage as an output at the first node N1. Further, when the power generation system 3 generates DC voltage, the power converter 210 may be configured to step up or down the DC voltage into DC voltage at a predetermined level for output at the first node N1.

For example, when the power generation system 3 includes a photovoltaic system, the power converter 210 may be a maximum power point tracking converter configured to detect the maximum power point according to solar flux change by solar or temperature change of solar heat to generate the output power. In addition, the power converter 210 may use various types of converters or rectifiers.

An inverter 230 includes a power converter formed between a first node N1 and a second node N2 connected to the load 2 or the grid connector 240. The inverter 230 performs DC-AC inversion or AC-DC inversion.

According to some embodiments, the converter 250 is configured to convert DC voltage output from the power grid 1 and converted by the inverter 230 or DC voltage output from the power generation system 3 and passing through the power converter 210, and supply the converted voltage to the battery. In some embodiments, the converter 250 steps up or steps down DC voltage output from the batteries 60 through the main battery management system 20 to transfer to the load 2 or the power grid 1. For example, when voltage level of the first node N1 is 380V, and the voltage level for charging the main battery management system 20 is 100V, the batteries 60 are charged by stepping down DC voltage of 380V into DC voltage of 100V. To power the load, DC voltage of 100V at the output of the main battery management system 20 is stepped up into DC voltage of 380V, and the stepped up voltage is supplied to the load 2 or the power grid 1. The converter 250 may include a buck mode operation switch, a synchronous rectifying switch, and an inductor functioning as a filter. Further, various forms of the converter 250 may be used.

A DC link capacitor 220 is connected between the power converter 210 or the inverter 230 and the converter 250. The DC link capacitor 220 stabilizes DC voltage level of the first node N1 by DC link voltage level. For example, the voltage level of the first node N1 becomes unstable due to rapid changes of power produced from the power generation system 3 or instantaneous voltage drop generating from the power grid 1. However, the voltage of the first node N1 needs to be maintained at a stable level regularly to successfully operate the inverter 230 and converter 250, and the DC link capacitor 220 performs such a role. The DC link capacitor 220 may be configured to be a super capacitor, and may use the energy storage device such as secondary cell (not shown).

The grid connector 240 is connected between the power grid 1 and the inverter 230. When the power grid 1 is in an abnormal state, the grid connector 240 blocks the connection between the power storage system 1000 and the power grid 1 under the control of the controller 200.

The grid connector 240 is configured to include switching elements, and may be a junction transistor (BJT), a field-effect transistor (FET) or the like.

Although not shown in the drawings, a switch may be further connected between the inverter 230 and the load 2. The switch is connected to the grid connector 240 in series, and blocks the power flowing into the load 2 under control of the controller 200. The switch is configured as a junction transistor (BJT), field effect transistor (FET), or the like.

Figure 3:
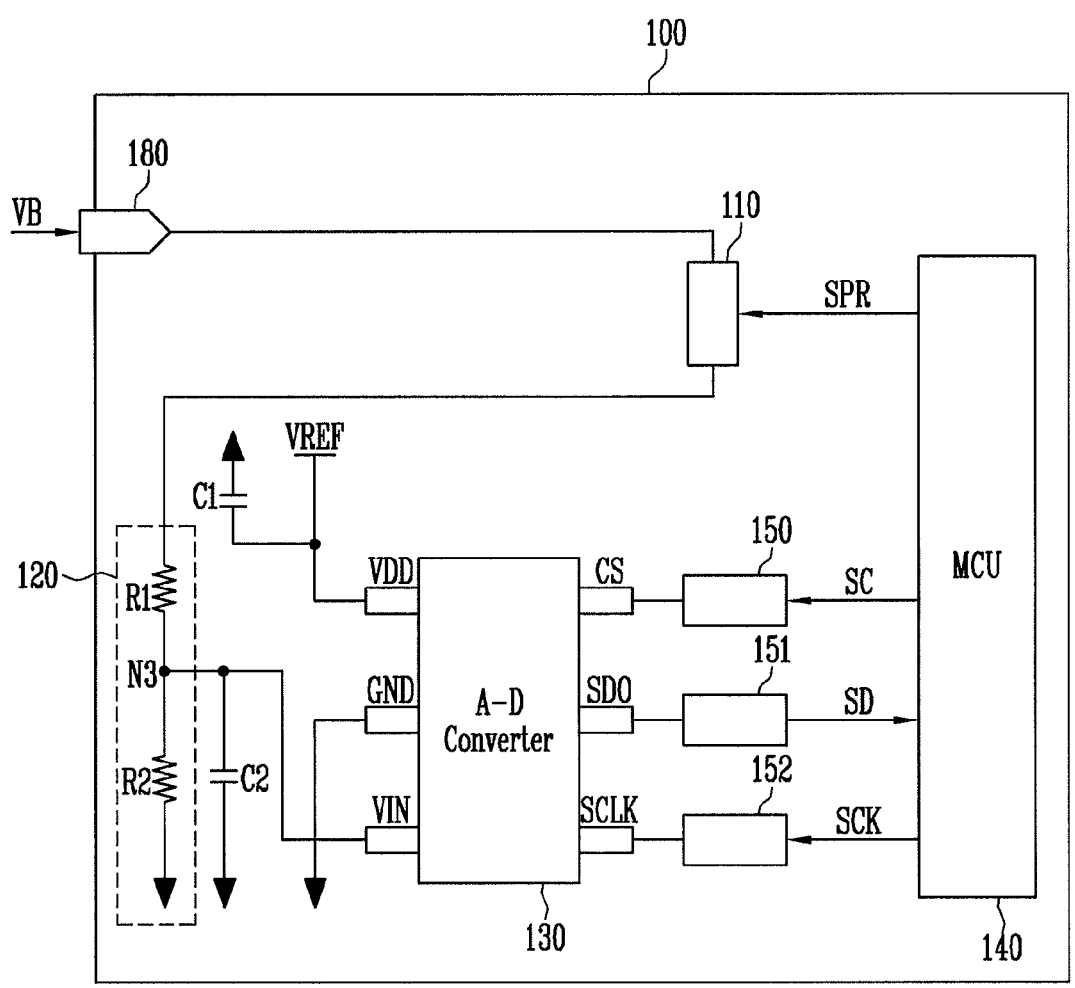
FIG. 3 shows a circuit for measuring voltage of a battery according to the embodiment of the invention.

FIG. 3 shows a circuit for measuring voltage of a battery according to the embodiment of the invention. Hereinafter, the circuit for measuring voltage of the battery 100 according to some embodiments will be described in detail with reference to FIG. 3.

The circuit for measuring voltage of the battery 100 according to some embodiments includes a switching element 110, a voltage conversion circuit 120, an analog-digital converter 130 and a controller 140, for example, a microcontroller unit (MCU) as shown in FIG. 3.

A switching element 110 is connected to an input stage 180, to which a first voltage VB output from at least one battery 60 is applied, to transfer the first voltage VB to the voltage conversion circuit 120. The switching element 110 is turned on in response to a voltage measuring control signal SPR transferred from the controller 140.

That is, when the switching element 110 is turned-on, the signal having the voltage level at the first voltage VB output from the batteries 60 is applied to the voltage conversion circuit 120, and when the switching element 110 is turned-off, the signal having a voltage level at the first voltage VB is blocked.

According to some embodiments, the switching element 110 is configured as an insulation switch to be electrically insulated from other components of the device. For example, to the switching element 110 can be configured as a photomos relay.

When the switching element 110 is configured as a photomos relay, since the input stage 180 to which the first voltage VB is applied, and the controller 140 supplying the voltage measuring control signal SPR to the voltage conversion circuit 120 and the switch element 110 are insulated from each other, a risk of damage to the controller 140 by the signal at the first voltage VB output from the battery 60 may be reduced.

The voltage conversion circuit 120 may convert the first voltage VB to be transferred, when the switching element 110 is turned-on, into a second signal at a second voltage level proportional to the first voltage VB. Further, the voltage conversion circuit 120 may be configured by a voltage distribution circuit that is configured to voltage-distribute the first voltage VB.

According to some embodiments as shown in FIG. 3, the voltage distribution circuit includes a plurality of resistors connected in series and a capacitor connected in parallel to at least one of the plurality of resistors.

For example, as shown in FIG. 3, the voltage distribution circuit includes a first resistor R1 and a second resistor R2, and the second signal having the second voltage level may be output at a node N3 connecting the first resistor R1 and second resistor R2.

A magnitude of the second voltage level that is output from the voltage conversion circuit 120 and is input to the analog-digital converter 130 is determined by a ratio of the resistors configuring the voltage conversion circuit 120. A second capacitor C2 can be provided to stably maintain the second voltage at the node N3.

The analog-digital converter 130 converts the signal at the second voltage received at the input VIN from the voltage conversion circuit 120 into digital signals SD. To perform the conversion operation as above, the second voltage output from the voltage conversion circuit 120 is input to a second voltage input stage VIN of the analog-digital converter 130, a reference voltage VREF may be input to a reference voltage input stage VDD, and a ground voltage may be input to a ground voltage input stage GND.

In addition, as shown in FIG. 3, a first capacitor C1 may be further connected to the reference voltage input stage VDD to which the reference voltage VREF is input. Further, the analog-digital converter 130 may be controlled by a control signal SC and clock signals SCK supplied from the controller 140.

The control signal SC may be input to a control signal input stage CS of the analog-digital converter 130, and the clock signals SCK may be input to a clock signal input stage SCLK of the analog-digital converter 130.

The analog-digital converter 130 outputs the converted digital signals SD to the controller 140 through an output stage SDO. The controller 140 may measure the first voltage VB supplied from the battery 60 by the digital signals SD output from the analog-digital converter 130.

That is, since the magnitudes of the resistors R1, R2 included in the voltage conversion circuit 120 are already known, it is possible to calculate the magnitude of the first voltage VB from the digital signals SD. The relationship of VB to the voltage VIN may be determined according to equation 1 below:

$$VIN = \frac{R2}{R1 + R2} * VB \qquad \text{EQ (1)}$$

As a result, the need for an expensive voltage detection IC may be eliminated by simplifying a circuit configuration, thereby significantly reducing the manufacturing cost of the power storage system 1000. Further, as shown in FIG. 3, the voltage detection circuit may be integrated in the power storage system 1000.

The circuit for measuring voltage of battery 100 according to the some embodiment of the invention further includes photo couplers 150, 151, 152 for performing electrical insulation between the analog-digital converter 130 and the controller 140.

For example, a second photo coupler 151 is positioned between an output stage SDO of the analog-digital converter 130 and the controller 140, and is configured to supply digital signals SD output from the analog-digital converter 130 to the controller 140.

Further, a first photo coupler 150 is positioned between a control signal input stage CS of the analog-digital converter 130 and the controller 140, and is configured to supply the control signal SC output from the controller 140 to the analog-digital converter 130.

Further, a third photo coupler 152 is positioned between clock signal input stage SCLK of the analog-digital converter 130, and the controller 140 and is configured to supply the clock signals SCK output from the controller 140 to the analog-digital converter 130.

As a result, in the circuit for measuring voltage of battery 100, the input stage 180 to which the first voltage VB having high voltage level is applied and the controller 140 may be insulated from each other, thereby preventing damage to the controller 140.

According to some embodiments, a circuit for measuring voltage of a battery and a power storage system using the same are disclosed. The circuit is configured to measure high voltage output from a number of batteries.

Further, according to some embodiments, a circuit for measuring voltage of a battery and a power storage system using the same are disclosed. The circuit is configured to prevent damage of a controller by performing electrical insulation between an input stage to which high voltage is applied and the controller.

According to one aspect, there is provided a circuit for measuring voltage of a battery including a switching element connected to the battery outputting a first voltage and to be turned-on in response to a voltage measuring command, a voltage conversion circuit connected to the switching element and configured to output a second voltage proportionate to the first voltage, a analog-digital converter receiving the second voltage and converting the received second voltage into digital signals, and a controller configured to transfer the voltage measuring commands to the switching element, and receive the digital signals of the analog-digital converter.

Further, the switching element may be an insulation switch. The insulation switch is a photomos relay. The voltage conversion circuit may be configured as a voltage distribution circuit. Further, the voltage distribution circuit includes a plurality of resistors connected in series, and a capacitor connected in parallel to at least one of the plurality of resistors.

According to some embodiments, the circuit also includes photo couplers disposed between the analog-digital converter and the controller and transferring the digital signal.

According to another aspect, a power storage system including a number of batteries, a number of sub-battery management system disposed for each battery and performing management of a corresponding battery, and a main battery management system receiving data of the battery from a number of sub-battery management system and including a circuit for measuring voltage of the battery for measuring a first voltage output from a number of batteries. The circuit for measuring voltage of the battery includes a switching element, to which the first voltage is applied, to be turned on in correspondence with voltage measuring commands, a voltage conversion circuit connected to the switching element and outputting a second voltage proportionate to the first voltage, a analog-digital converter receiving the second voltage and converting the received second voltage into digital signals, and a controller transferring the voltage measuring commands to the switching element, and receiving the digital signals of the analog-digital converter.

Further, the switching element may be configured as an insulation switch. The insulation switch may be a photomos relay. The voltage conversion circuit may be configured as a voltage distribution circuit. Further, the voltage distribution circuit includes a plurality of resistors connected in series, and a capacitor parallel-connected to at least one of the plurality of resistors.

The circuit for measuring voltage of the battery further includes photo couplers disposed between the analog-digital converter and the controller and transferring the digital signal.

While the present invention has been described in connection with some embodiments, it is to be understood that the invention is not limited to the disclosed embodiments, but, on the contrary, is intended to cover various modifications and equivalent arrangements included within the spirit and scope of the appended claims, and equivalents thereof.

What is claimed is:

1. A circuit for measuring voltage of a battery, comprising:
a switching element connected to the battery and outputting a first signal at a first voltage level, the switching element being configured to be turned on or turned off based on a voltage measurement control signal;
a voltage conversion circuit connected to the switching element and configured to receive the first signal from the switching element and output a second signal at a second voltage level proportional to the first voltage level;
an analog-digital converter configured to receive the second signal and convert the received second signal into a digital signal; and
a controller configured to transfer the voltage measurement control signal to the switching element, and to receive the digital signal from the analog-digital converter;
wherein the switching element is configured to transfer the first signal to the voltage conversion circuit and isolate the controller from the first signal when the switching element is turned on, and wherein the switching element does not transfer the first signal to the voltage conversion circuit when the switching element is turned off.

2. The circuit for measuring voltage of a battery according to claim 1, wherein the switching element comprises an insulation switch to isolate the controller from the first signal when the switching element is turned on.

3. The circuit for measuring voltage of the battery according to claim 2, wherein the insulation switch comprises a photomos relay.

4. The circuit for measuring voltage of a battery according to claim 1, wherein the voltage conversion circuit comprises a voltage distribution circuit.

5. The circuit for measuring voltage of the battery according to claim 4, wherein the voltage distribution circuit includes a plurality of resistors connected in series, and a capacitor connected in parallel to at least one of the plurality of resistors.

6. The circuit for measuring voltage of the battery according to claim 5, wherein the second voltage is proportional to the first voltage based on a resistance of the resistors.

7. The circuit for measuring voltage of the battery according to claim 1, further comprising at least one photo coupler disposed between the analog-digital converter and the controller, the photo couplers configured to transferring the digital signals between the controller and the analog-digital converter.

8. A power storage system, comprising:
at least one battery;
at least one sub-battery management systems connected to each of the at least one battery and configured to perform management of a corresponding battery; and
a main battery management system configured to receive data corresponding to the at least one battery from the at least one sub-battery management system, the main battery management system including a detection circuit configured to measure voltage output of the at least one battery,
wherein the detection circuit comprises;
a switching element configured to receive a first signal at a first voltage level from the at least one battery, the switching element configured to be turned on or turned off in response to a voltage measurement control signal;
a voltage conversion circuit connected to the switching element and configured to receive the first signal from the switching element and output a second signal at a second voltage level that is proportional to the first voltage level;
an analog-digital converter configured to receive the second signal and convert the received second signal into a digital signal; and
a controller configured to transfer the voltage measurement control signal to the switching element, and to receive the digital signals from the analog-digital converter, and
wherein the switching element is configured to transfer the first signal to the voltage conversion circuit and isolate the controller when the switching element is turned on and wherein the switching element does not transfer the first signal to the voltage conversion circuit when the switching element is turned off.

9. The power storage system according to claim 8, wherein the switching element comprises an insulation switch to isolate the controller from the first signal when the switching element is turned on.

10. The power storage system according to claim 9, wherein the insulation switch comprises a photomos relay.

11. The power storage system according to claim 8, wherein the voltage conversion circuit comprises a voltage distribution circuit.

12. The power storage system according to claim 11, wherein the voltage distribution circuit includes a plurality of resistors connected in series, and a capacitor connected in parallel to at least one of the plurality of resistors.

13. The power storage system according to claim 12, wherein the second voltage level is proportional to the first voltage level based on a resistance of the resistors.

14. The power storage system according to claim 8, further comprising at least one photo coupler disposed between the analog-digital converter and the controller, the photo couplers configured to transfer digital signals between the analog-digital converter and the controller.

15. A method for measuring voltage of a battery, comprising:
transmitting, by a controller, a voltage measurement control signal to a switching element so that the switching element transfers
a first signal at a first voltage level that is output from the battery to a voltage conversion circuit in response to the voltage measurement control signal, the switching element being configured to isolate the battery from the controller when the switching element is turned on;
receiving a digital signal that is converted from a second signal, the second signal is output from the voltage conversion circuit at a second voltage level that is proportional to the first voltage level; and
determining at least one characteristic of the battery based on the received digital signal.

16. The method for measuring voltage of a battery according to claim 15, wherein the at least one characteristic comprises a parameter indicative of one or more of overcharge, overdischarge, overcurrent, and cell balancing state of the battery.

17. The method for measuring voltage of a battery according to claim 15, wherein the second voltage level is proportional to the first voltage level based on a resistance of a plurality of resistors.

18. The method for measuring voltage of a battery according to claim 15, further comprising receiving data corresponding to the battery from a battery management system, and determining the at least one characteristic based at least in part on the received data.

19. The method for measuring voltage of a battery according to claim 15, wherein the at least one characteristic comprises one of a state of charge and a state of health of the battery.

\* \* \* \* \*